United States Patent
Miyajima

(10) Patent No.: US 7,349,063 B2
(45) Date of Patent: Mar. 25, 2008

(54) REFLECTION MIRROR APPARATUS, EXPOSURE APPARATUS AND DEVICE MANUFACTURING METHOD

(75) Inventor: Yoshikazu Miyajima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 286 days.

(21) Appl. No.: 10/647,376

(22) Filed: Aug. 26, 2003

(65) Prior Publication Data

US 2005/0073663 A1 Apr. 7, 2005

Related U.S. Application Data

(63) Continuation of application No. PCT/JP03/07796, filed on Jun. 19, 2003.

(30) Foreign Application Priority Data

Jun. 28, 2002 (JP) .............................. 2002-191282

(51) Int. Cl.
G03B 27/52 (2006.01)
G03B 27/42 (2006.01)
G03B 27/54 (2006.01)
G02B 7/195 (2006.01)

(52) U.S. Cl. .......................... 355/30; 355/53; 355/67; 359/845

(58) Field of Classification Search .................. 355/30, 355/40, 53, 67, 71, 77; 359/815–817, 812–813, 359/512, 830, 845, 519, 838; 250/429
See application file for complete search history.

(56) References Cited

U.S. PATENT DOCUMENTS

| | | | | |
|---|---|---|---|---|
| 4,253,739 A | * | 3/1981 | Carlson | 359/845 |
| 4,674,848 A | * | 6/1987 | Aldrich et al. | 359/845 |
| 4,743,104 A | * | 5/1988 | Eng et al. | 359/845 |
| 4,844,603 A | * | 7/1989 | Eitel et al. | 359/845 |
| 5,390,228 A | * | 2/1995 | Niibe et al. | 378/34 |
| 6,091,494 A | * | 7/2000 | Kreikebaum | 356/336 |
| 6,118,527 A | * | 9/2000 | Jurca | 356/239.1 |
| 6,359,678 B1 | | 3/2002 | Ota | |
| 6,504,597 B2 | * | 1/2003 | Schuster et al. | 355/67 |
| 2001/0038446 A1 | | 11/2001 | Takahashi | |
| 2001/0048514 A1 | * | 12/2001 | Taniguchi | 355/53 |
| 2002/0027644 A1 | * | 3/2002 | Bisschops | 355/30 |

(Continued)

FOREIGN PATENT DOCUMENTS

EP 1 061 561 12/2000

(Continued)

*Primary Examiner*—Alan Mathews
(74) *Attorney, Agent, or Firm*—Fitzpatrick Cella Harper & Scinto

(57) ABSTRACT

A reflection mirror apparatus, used in a reflection optical system of an exposure apparatus which performs exposure processing by guiding exposure light by reflection, has a mirror having a reflection surface to reflect the exposure light, and radiation plates for radiation-cooling provided in positions away from an outer surface of the mirror. The radiation plates are provided so as to ensure a passage area for the exposure light incident on and reflected from the reflection surface of the mirror. Further, the respective radiation plates are temperature-controlled by cooling liquid flowing through cooling pipes. Thus the temperature rise of the mirror used in the reflection optical system of the exposure apparatus can be suppressed, and the accuracy of surface form of the mirror reflection surface can be maintained.

15 Claims, 13 Drawing Sheets

U.S. PATENT DOCUMENTS

| | | |
|---|---|---|
| 2002/0041368 A1 | 4/2002 | Ota et al. |
| 2002/0089652 A1* | 7/2002 | Lim .............................. 355/27 |
| 2002/0171818 A1* | 11/2002 | Minnaert et al. ............. 355/69 |
| 2003/0169520 A1* | 9/2003 | Goldstein .................... 359/845 |
| 2003/0235682 A1* | 12/2003 | Sogard .................... 428/195.1 |
| 2005/0099611 A1* | 5/2005 | Sogard ......................... 355/30 |

FOREIGN PATENT DOCUMENTS

| | | |
|---|---|---|
| EP | 1 178 357 A | 2/2002 |
| EP | 1 387 054 A | 2/2004 |
| EP | 1 447 717 A2 | 8/2004 |
| JP | 05-291117 | 11/1993 |
| JP | 9-92613 A | 4/1997 |
| JP | 2001-215105 | 8/2001 |
| WO | 01/42855 | 6/2001 |

* cited by examiner

REFLECTION MIRROR APPARATUS, EXPOSURE APPARATUS AND DEVICE MANUFACTURING METHOD

TECHNICAL FIELD

The present invention relates to an exposure apparatus used in a semiconductor manufacturing process, and more particularly, to an exposure apparatus with extreme ultraviolet light as an exposure light source and a reflection mirror apparatus used in a reflection optical system of the exposure apparatus.

BACKGROUND ART

As a projection exposure apparatus in which a reticle pattern is projected and transferred on a silicon wafer, an apparatus using extreme ultraviolet (EUV) light having a wavelength of 13 to 14 nm as an exposure light source has been proposed. As the extreme ultraviolet light is greatly attenuated when it passes through an object, an optical control system using an optical lens cannot be employed. Accordingly, in the above exposure apparatus using the extreme ultraviolet light as an exposure light source, the exposure light is controlled by plural mirrors provided in a vacuum space (reflection optical system).

The reflection optical system of this exposure apparatus includes an exposure-light introduction optical system to guide exposure light from the light source to a reflective original plate (hereinbelow, reticle) and a reduced projection optical system for reduced projection of an exposure pattern on a wafer by the exposure light reflected from the reticle. The respective optical systems have plural mirrors. FIGS. 10A and 10B are explanatory views showing the form of a general concave-surface type mirror available in the above-described reflection optical system. The reflection surface of the mirror is a concave surface, however, a convex-surface type mirror can be employed. The mirror, having a reflection surface obtained by forming an Mo—Si multilayer film by vapor deposition or sputtering, reflects the exposure light from the light source.

However, upon reflection of exposure light by the above-described mirror, the reflectivity of the exposure light per one surface is about 70%, and the residual light is absorbed in the mirror base material and converted to heat. FIGS. 11A and 11B are explanatory views a temperature rise in the mirror. As shown in FIGS. 11A and 11B, in an exposure light reflection area, the temperature rises about +10 to 20° C. As a result, even if a mirror material having an extremely small thermal expansion coefficient is used, about 25 nm displacement occurs in the reflection surface in the exposure reflection area, and about 50 to 100 nm displacement occurs in the reflection surface in a mirror peripheral portion.

On the other hand, in a projection optical system mirror provided in the reduced projection optical system, an illumination system mirror and a light source mirror provided in the exposure-light introduction optical system, the accuracy of form of the reflection surface (hereinbelow, referred to as "accuracy of surface form") must be 1 nm or smaller. Accordingly, as apparent from the above description, the extremely high accuracy of the surface form of about 1 nm cannot be ensured due to displacement of the mirror reflection surface by heat.

In the case of the projection optical system, the above degradation of the accuracy of the surface form in the mirror causes degradation of image formation performance and illumination on the wafer. For example, in the case of the illumination system mirror, the degradation of accuracy of the surface form causes a reduction of illumination and degradation of illumination evenness in the exposure light to a mask. Further, in the case of the optical source mirror, the degradation of the accuracy of the surface form causes degradation of illumination due to poor focusing of the light source. Such degradation causes degradation of basic performance of the exposure apparatus such as degradation of exposure accuracy and throughput.

Accordingly, it is desired to suppress a temperature rise of the mirror used in the reflection optical system of the exposure apparatus and to maintain the accuracy of the surface form of the mirror reflection surface.

DISCLOSURE OF INVENTION

According to one aspect of the present invention, a reflection mirror apparatus in an exposure apparatus, constructing a reflection optical system to guide exposure light by reflection is provided, which comprises: a mirror having a reflection surface that reflects the exposure light; a radiation plate for radiation-cooling, provided away from an outer surface of the mirror, that ensures a passage area for the exposure light incident on and reflected from the reflection surface; and a temperature control mechanism for temperature control of the radiation plate.

According to another aspect of the present invention, there is provided an exposure apparatus which utilizes the above reflection mirror apparatus for its reflection optical system. Furthermore, according to another aspect of the present invention, there is provided a device manufacturing method for forming a circuit pattern on a semiconductor substrate by using the above exposure apparatus.

Other features and advantages of the present invention will be apparent from the following description taken in conjunction with the accompanying drawings, in which like reference characters designate the same name or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

BEST MODE FOR CARRYING OUT THE INVENTION

Preferred embodiments of the present invention will now be described in detail in accordance with the accompanying drawings.

First Embodiment

Figure 1:
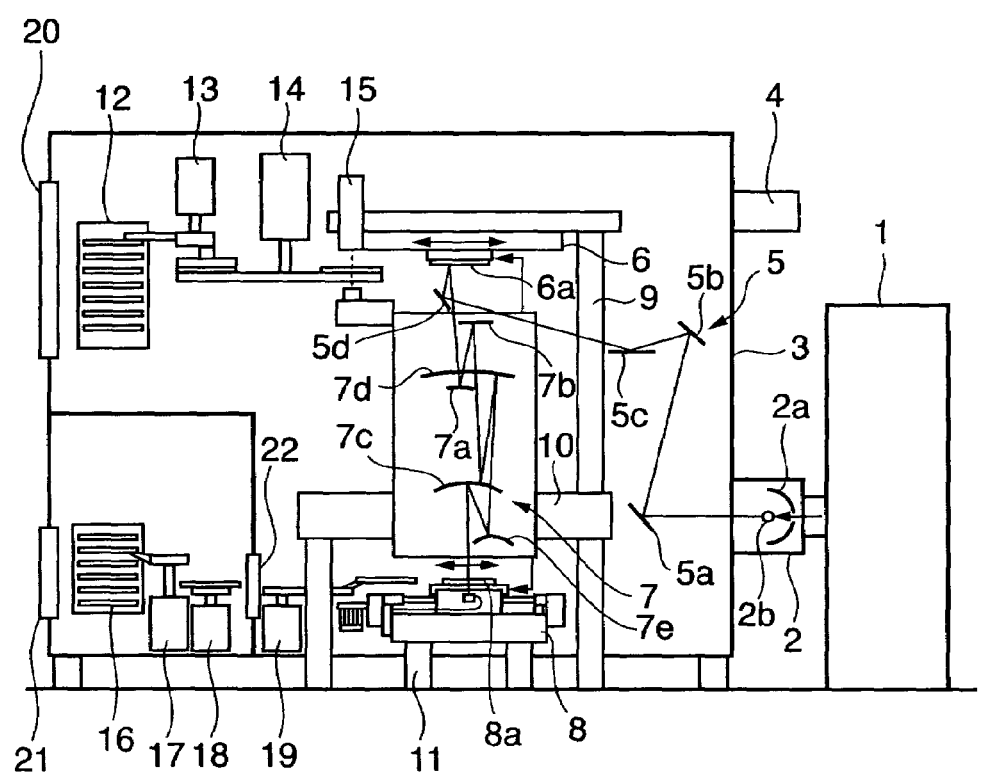
FIG. 1 is a schematic cross-sectional view showing the entire structure of an exposure apparatus according to a first embodiment of the present invention.

FIG. 1 is a schematic cross-sectional view showing the structure of an exposure apparatus according to a first embodiment of the present invention. In FIG. 1, reference numeral 1 denotes an excitation laser. The laser is emitted toward a point where a light source material is gasified, liquefied or spray-gasified, as a light emission point of light source, for plasma excitation of atoms of the light source material, thereby emitting extreme ultraviolet light. In the present embodiment, a YAG solid laser or the like is used as the excitation laser.

Figure 2A:
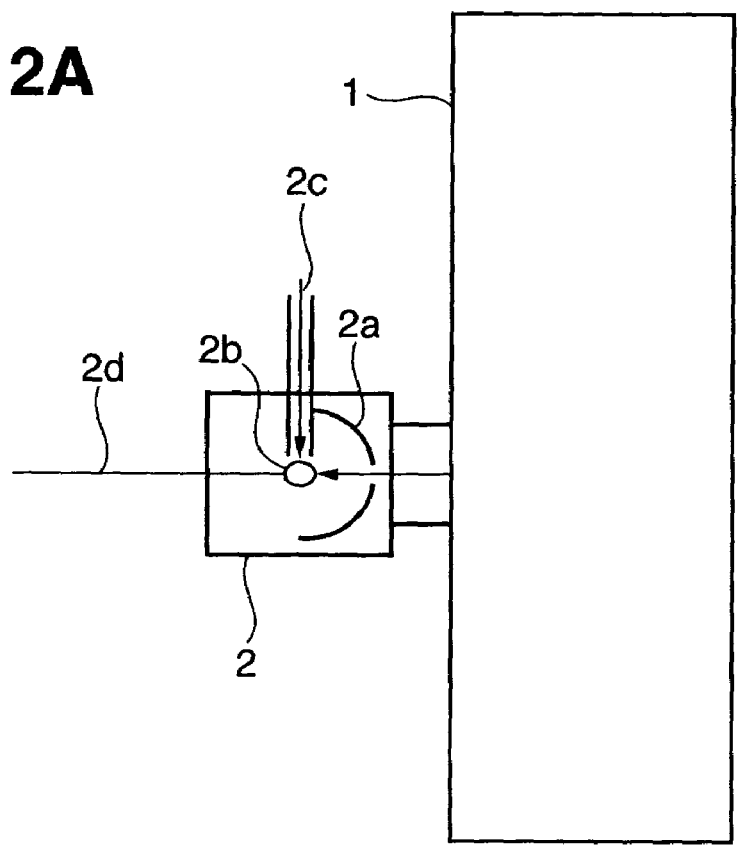
FIGS. 2A and 2B are explanatory views showing the details of a light source unit according to the first embodiment.
Figure 2B:
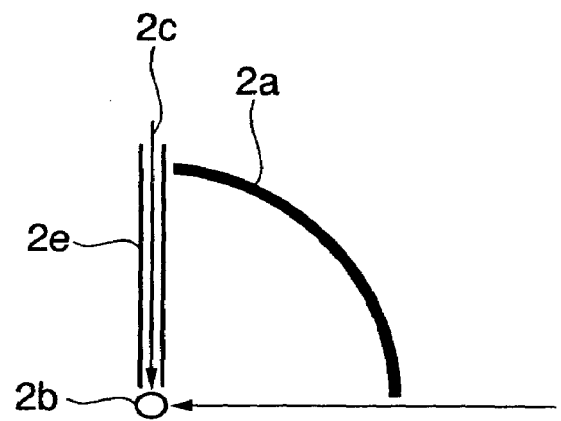

Numeral 2 denotes a light source unit having a structure in which a vacuum status is maintained. FIGS. 2A and 2B show the internal structure of the light source unit 2. Numeral 2b denotes a light source indicating an actual light emission point of exposure light source. Numeral 2a denotes a light source mirror which gathers all the light from the light source 2b and reflects the light in a light emission direction, thus generating exposure light 2d. The light source mirror 2a is provided as a semispherical mirror with the light source 2b in the central position. Numeral 2e denotes a nozzle which supplies liquefied light emission element Xe, spray-liquefied light emission element Xe or Xe gas to the position of the light source 2b.

Numeral 3 denotes a vacuum chamber accommodating the entire exposure apparatus. Numeral 4 denotes a vacuum pump which evacuates the vacuum chamber 3 thereby maintaining the vacuum status. Numeral 5 denotes an exposure light introduction unit which introduces and shapes the exposure light from the light source unit 2. The exposure light introduction unit 5 having mirrors 5a to 5d homogenizes and shapes the exposure light.

Numeral 6 denotes a reticle stage where an original plate 6a as a reflection original plate of an exposure pattern is placed on a movable member. Numeral 7 denotes a reduced projection mirror optical system which performs reduced projection of the exposure pattern reflected from the original plate 6a onto a wafer. In the reduced projection mirror optical system 7, the exposure light is sequentially projection-reflected by mirrors 7a to 7e, and finally, the exposure pattern is reduce-projected on the wafer at a predetermined reduction ratio.

Numeral 8 denotes a wafer stage holding a wafer 8a. The wafer 8a is an Si substrate on which the exposure pattern on the original plate 6a is reduce-projected and exposed. The wafer stage 8 is position-controlled in directions of tilting about XYZ and XY axes and rotation about the Z axis for positioning the wafer 8a to a predetermined exposure position.

Numeral 9 denotes a reticle stage support member which supports the reticle stage 6 to an apparatus installation floor. Numeral 10 denotes a projection system main body which supports the reduced projection mirror optical system 7 to the apparatus installation floor. Numeral 11 denotes a wafer stage support member which supports the wafer stage 8 to the apparatus installation floor. Further, provided is means (not shown) for measuring relative positions between the reticle stage 5 and the reduced projection mirror optical system 7 and between the reduced projection mirror optical system 7 and the wafer stage 8, independently supported by the reticle stage support member 9, the projection system main body 10 and the wafer stage support member 11, and continuously holding these elements in predetermined relative positions. Further, the reticle stage support member 9, the projection system main body 10 and the wafer stage support member 11 are provided with a mount (not shown) to isolate vibration from the apparatus installation floor.

Numeral 12 denotes a reticle stocker where the original plate (reticle) 6a from the outside the apparatus is temporarily stored inside the apparatus. In the reticle stocker 12, reticles corresponding to different patterns and different exposure conditions are stored in a hermetically-sealed container. Numeral 13 denotes a reticle changer which selects a reticle to be used from the reticle stocker 12 and conveys the selected reticle.

Numeral 14 denotes a reticle alignment unit having a rotation hand rotatable about XYZ and Z axes. The reticle alignment unit 14 receives the original plate 6a from the reticle changer 13, and 180° rotate-conveys the reticle such that an alignment mark in the original plate 6a comes within the view of a reticle alignment scope 15 provided at the end of the reticle stage 6. Then the original plate 6a is slightly moved in XYZ-axis rotation directions with respect to the alignment mark 15a with reference to the reduced projection mirror optical system 7, thus performing alignment. That is, the alignment mark in the original plate 6a is aligned with the alignment mark 15a by slightly moving the original plate 6a in the XY shift direction and z-axis rotation direction. In this manner, when the original plate 6a is fixed on the reticle stage 6, the original plate is aligned with reference to the projection system. The aligned original plate 6a is chucked onto the reticle stage 6.

Numeral 16 denotes a wafer stocker in which the wafer 8a from the outside the apparatus is temporarily stored inside the apparatus. In the wafer stocker 16, plural wafers are stored in a container. Numeral 17 denotes a wafer conveyance robot which selects a wafer to be exposure-processed from the wafer stocker 16 and conveys the selected wafer to a wafer mechanical-prealignment temperature control unit 18. The wafer mechanical-prealignment temperature control unit 18 performs rough control of feeding in a wafer rotational direction and at the same time controls the wafer temperature to a controlled temperature inside the exposure apparatus. Numeral 19 denotes a wafer feeding hand which feeds the wafer which has been aligned and temperature-controlled in the wafer mechanical-prealignment temperature control unit 18 to the wafer stage 8.

Numerals 20 and 21 denote gate valves as gate opening/closing mechanisms to insert the reticle and the wafer from the outside the apparatus. Numeral 22 also denotes a gate valve which opens/closes only when the wafer is carried out from the apparatus in which the space including the wafer stocker 16 and the wafer mechanical-prealignment temperature control unit 18 is separated from the space of exposure by a partition wall. In this manner, as the inside of the apparatus is separated by the partition wall, the volume opened to the atmosphere is limited to a minimum value, and the vacuum parallel status is quickly restored.

The mirrors 5a to 5d of the exposure light introduction unit 5 introduce and shape the exposure light from the light source unit 2 and the mirrors 7a to 7e of the reduced projection system 7 respectively have a reflection surface obtained by forming an Mo—Si multilayer film by vapor deposition or sputtering, and reflect the exposure light from the light source with the reflection surfaces. At this time, the reflectivity of the mirror reflection surface is about 70% and the residual light is absorbed in the mirror base material and converted to heat. As a result, as described with reference to FIGS. 11A and 11B, in the exposure light reflection area, the temperature rises about +10 to 20° C. Due to this temperature rise, even if a mirror material with a extremely small thermal expansion coefficient is used, about 50 to 100 nm displacement occurs in the mirror peripheral portion of the reflection surface. Accordingly, the accuracy of the surface form of the respective mirrors cannot be ensured in the light source unit 2, the exposure light introduction unit 5 and the reduced projection mirror optical system 7 in which extremely high accuracy of the surface form of about 1 nm is required.

In the case of the projection optical system, the degradation of the accuracy of the surface form of the mirrors causes degradation of image formation performance and illumination on the wafer, and causes reduction of illumination and degradation of illumination evenness in the exposure light to a mask by the exposure light introduction unit 5. Further, in a case where the accuracy of the surface form of the light source mirror 2a is degraded in the light source unit 2, focusing of the light source becomes poor, and the illumination is degraded.

In the present embodiment, to solve the problems due to the temperature rise in the mirrors, a mirror cooling mechanism is provided to suppress the temperature rise in the mirrors so as to maintain the accuracy of the surface form of the mirrors. Note that as the form of mirror differs in respective portions, the cooling mechanism for a cylindrical concave mirror is shown as a representative cooling mechanism. That is, the respective mirrors in the light source unit 2, the exposure light introduction unit 5 and the reduced projection mirror optical system 7 are provided with a cooling mechanism to be described below.

Figure 3A:
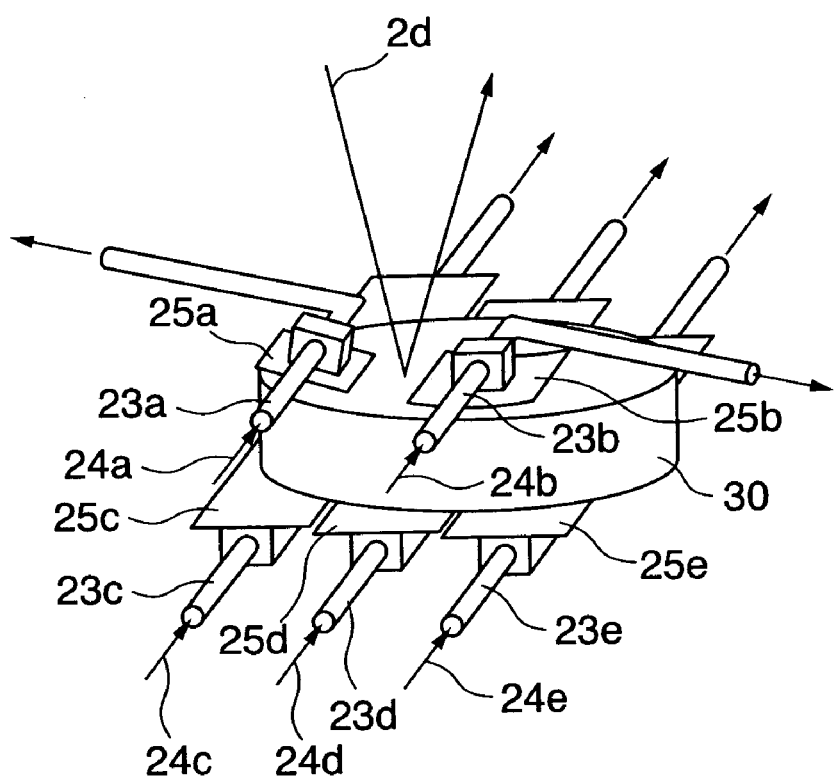
FIGS. 3A and 3B are explanatory views showing a mirror cooling mechanism according to the first embodiment.
Figure 3B:
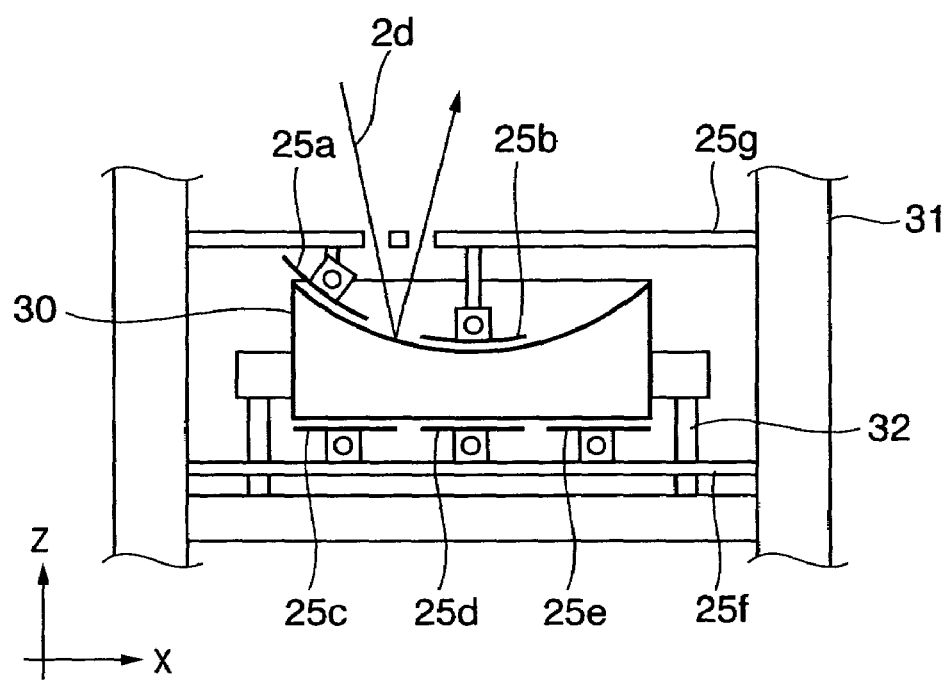

FIG. 3A shows the overview of the mirror to which the mirror cooling mechanism according to the first embodiment is attached. FIG. 3B is a schematic cross-sectional view explaining a status where the mirror and the cooling mechanism in FIG. 3A are accommodated in a mirror barrel. As show in FIGS. 3A and 3B, radiation plates 25a to 25e are provided away from an exposure-light reflection portion of a mirror 30. Note that the radiation plates 25a and 25b are spherical radiation plates corresponding to the concave surface form of the mirror. Further, the radiation plates 25a to 25e are connected to cooling pipes 23a to 23e, and coolant 24a to 24e as temperature cooling media optimized for the respective radiation plates are supplied/collected. Note that in the present embodiment, the coolant is circulated, however, another cooling medium such as cooling gas may be used.

Further, as shown in FIG. 3B, in the cylindrical concave mirror, the mirror 30 is supported in the mirror barrel 31 via a mirror support member 32. Further, the radiation plates 25a and 25b are supported by a radiation plate support member 25g, and the radiation plates 25c to 25e are supported by a radiation plate support member 25f, in the mirror barrel 31. At this time, a passage area for the exposure light 2d incoming and outgoing to/from the reflection surface of the mirror 30 is ensured between the radiation plates 25a and 25b.

Figure 4:
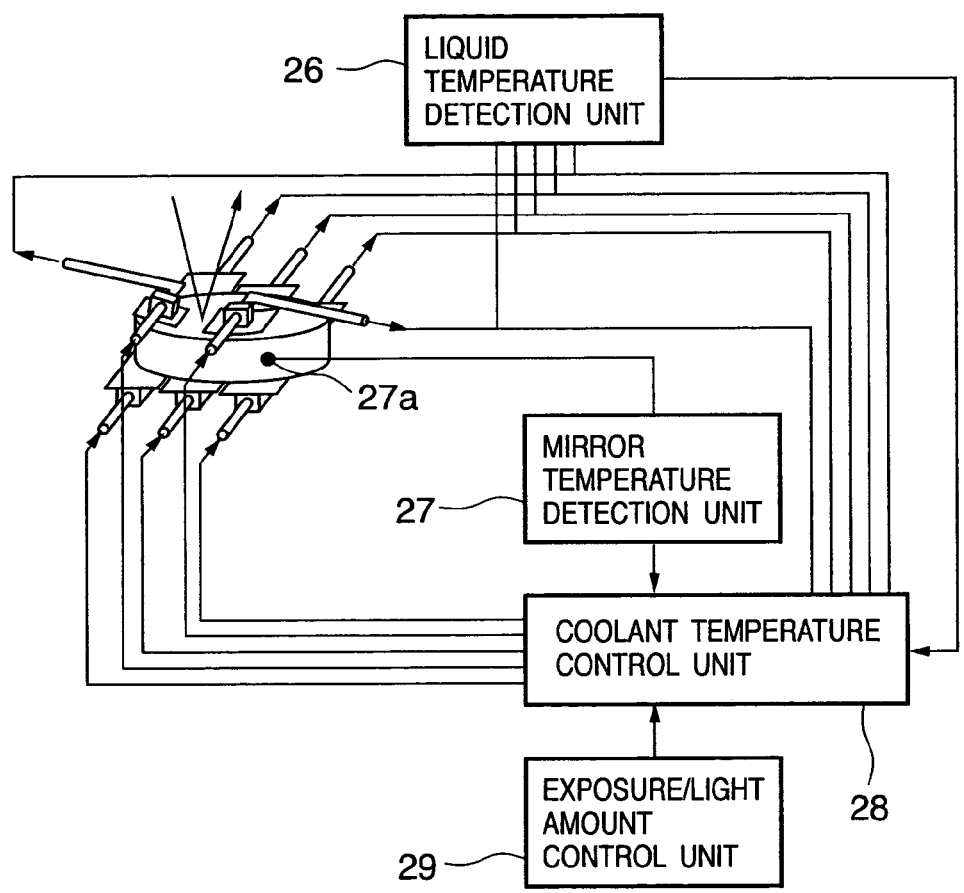
FIG. 4 is a block diagram showing a mirror temperature control system according to the first embodiment.

FIG. 4 is a block diagram showing a mirror temperature control system according to the first embodiment. In FIG. 4, numeral 26 denotes a liquid temperature detection unit which detects temperatures of the respective coolant 24a to 24e discharged after cooling of the heat of the mirror 30 by radiation. Numeral 27 denotes a mirror temperature detection unit which monitors the surface temperature of the mirror 30 by thermometer 27a attached to the mirror 30. Numeral 28 denotes a coolant temperature control unit which controls the circulating coolant 24a to 24e to a target temperature. Numeral 29 denotes an exposure/light amount control unit which controls light emission timing and the amount of exposure light. Note that the thermometer 27a which provides temperature information to the mirror temperature detection unit 27 may be provided in plural positions of the mirror 30.

In this construction, the surface temperature of the mirror 30 is measured by the mirror temperature detection unit 27, and at the same time, the temperatures of the discharged coolant 24a to 24e are detected by the liquid temperature detection unit 26. Further, exposure light amount information of the exposure light emitted to the mirror 30 is detected by the exposure/light amount control unit 29. The coolant temperature control unit 28 determines target temperatures for the coolant 24a to 24e based on these detection signals and exposure light amount information from the respective units, and controls the coolant 24a to 24e to the target temperature values.

Further, as the plural radiation plates are independently temperature-controlled, it is desirable that the thermometer 27a is provided on the mirror surface in positions near the respective radiation plates. On the other hand, if the number of the thermometers 27a is one or smaller than the number of the radiation plates, the temperature distribution on the mirror is previously measured, and temperatures in plural positions are predicted from the measured temperature distribution. That is, the temperature distribution in the mirror surface is stored in a table, the temperature distribution in the mirror surface is predicted from the result of measurement of mirror temperature and measurement positions, then coolant temperatures are determined, and the respective radiation plates are temperature-controlled.

Further, the coolant temperature control unit 28 predicts a coolant temperature to control the temperatures of the coolant for the respective radiation plates so as to control the mirror temperature to a target temperature (e.g. 23° C.), and controls the temperatures of the coolant. The temperature control is performed by e.g. detecting a change in the mirror temperature and performing feed-forward control on the liquid temperature. Further, the control values are obtained as follows.

(1) The mirror temperature is measured by the mirror temperature detection unit 27, and the exit-side temperature of the mirror coolant is measured by the liquid temperature detection unit 26.

(2) The temperature change amounts in the mirror and coolant and the change rate (change amount of mirror temperature or coolant temperature per time) are calculated from the result of measurement in (1).

(3) A cooling speed necessary to control the mirror temperature to a target temperature within a target time is obtained based on the result of calculation in (2), a temperature set for the supplied coolant (supplied cooling medium temperature) is determined based on the cooling speed, and the change rate is calculated.

(4) A temperature command value for the coolant in the coolant temperature control unit 28 is determined based on the temperature and the change rate obtained in (3).

(5) (1) to (4) are performed in a real-time manner.

Note that as the information on the exposure/light amount control, upon a determination of the temperature command value in (4), a predicated value of temperature change corresponding to an increment of the exposure light amount is added in the form of a correction coefficient.

The coolant 24a to 24e controlled to the target temperatures by the coolant temperature control unit 28 flow through the cooling pipes 23a to 23e, thereby cooling the radiation plates 25a to 25e to appropriate temperatures. Thus, the mirror 30 is radiation-cooled by the difference between the surface temperatures of the radiation plates 25a to 25e provided in positions near the mirror 30 and away from the exposure-light reflection portion, and the surface temperature of the mirror 30.

Figure 5A:
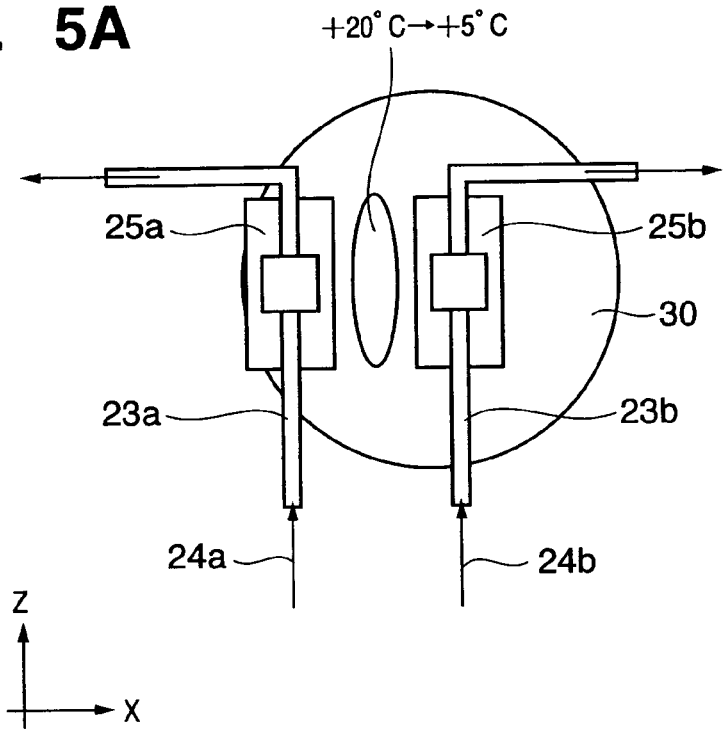
FIGS. 5A and 5B are explanatory views showing temperature distribution in a mirror surface in a temperature control status by the mirror cooling mechanism according to the first embodiment.
Figure 5B:
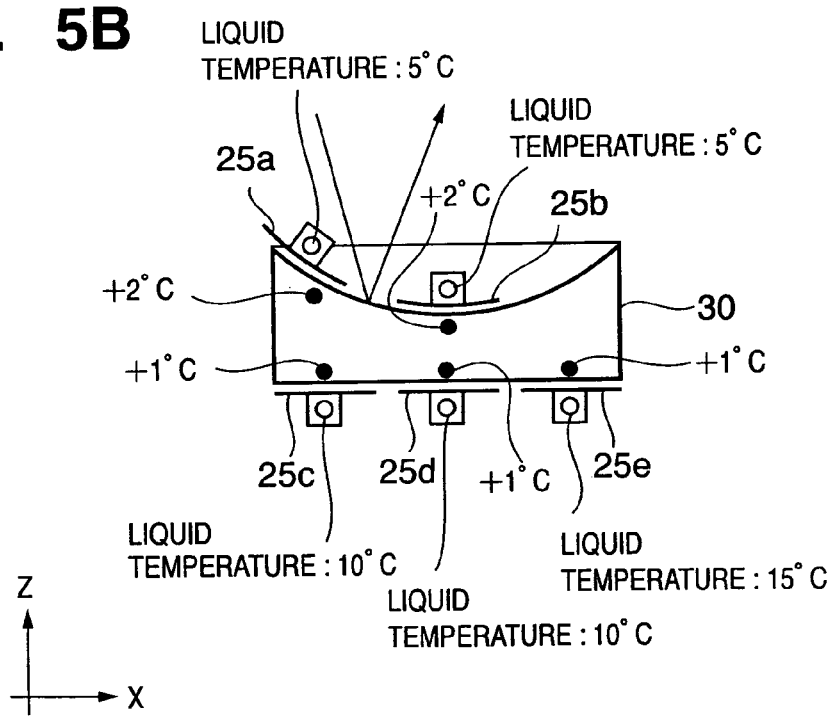

FIGS. 5A and 5B are explanatory views showing the temperature distribution on the mirror surface in a temperature control status by the radiation plates 25a to 25e. The coolant 24a to 24e to flow through the cooling pipes 23a to 23e is controlled to respectively optimize the temperature by the coolant temperature control unit 28. In the example of the figures, the liquid temperatures of the coolant 24a and 24b are set to about 5° C.; the liquid temperatures of the coolant 24c and 24d are set to about 10° C.; and the liquid temperature of the coolant 24e is set to about 15° C.

In this manner, as the coolant 24a to 24e at respectively optimized liquid temperatures flows through the radiation plates 25a to 25e, the temperature rise is suppressed to about +2° C. in the high temperature portion of the exposure light reflection area. The temperature rise in this case is greatly suppressed in comparison with the conventional temperature rise of +10° to 20° C. Further, in the temperature of the rear surface of the mirror, the temperature rise is greatly suppressed to about +1° C. in comparison with the conventional temperature rise of +5° to 3° C. As a result, the temperature rise of the entire mirror is suppressed within 1° to 2° C. The thermal distortion is reduced, and the accuracy of the surface form is stabilized to 1 nm or smaller.

Note that in the mirror temperature control system described in the first embodiment, the object thermometer is provided in the mirror base member as the mirror temperature detection unit 27, however, the means for detecting the temperature of the mirror is not limited to the thermometer. For example, a radiation thermometer may be provided in a position away from the mirror for measurement of the mirror temperature.

Second Embodiment

Figure 6:
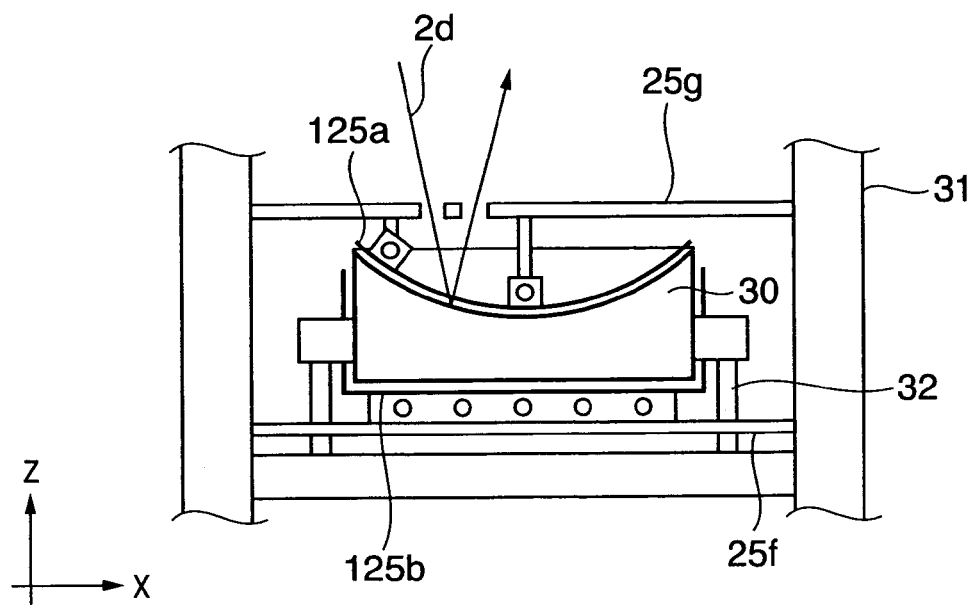
FIG. 6 is an explanatory view showing the mirror cooling mechanism according to a second embodiment of the present invention.

FIG. 6 shows the cooling mechanism according to a second embodiment of the present invention. In FIG. 6, constituent elements corresponding to those in the first embodiment (FIG. 3B) have the same reference numerals. In the first embodiment, plural separate radiation plates are provided for the exposure light reflection surface and the rear surface of the mirror, and respectively optimized temperature-control cooling media are passed through the respective radiation plates. In the second embodiment, as shown in FIG. 6, radiation plates 125a and 125b are simply separated for the exposure light reflection surface and the rear surface of the mirror 30. Note that the radiation plate 125a is provided with an opening (not shown) to ensure a passage area for the exposure light 2d incoming and outgoing to/from the reflection surface of the mirror 30. Further, the cooling mechanism having this form is preferably used in a portion where the amount of exposure light incident on the mirror is small and the sensitivity to optical distortion is low.

For example, the sensitivity of the illumination system mirror is lower than that of the projection system mirror. Further, the mirror with a small exposure light amount is a mirror near the final mirror in the light source of the illumination system. That is, the mirror in "a portion where the amount of exposure light incident on the mirror is small and the sensitivity to optical distortion is low", the final mirror and mirrors around the final mirror in the illumination system.

As the temperature control in use of the radiation plates according to the second embodiment is performed simply regarding the front and rear surfaces of the mirror, the control is more simple than the temperature control according to the first embodiment. However, the idea of the control is the same as that according to the first embodiment. Note that the temperatures of cooling media are determined based on a mean value of the temperatures in the entire front surface of the mirror and a mean value of the temperatures in the entire rear surface of the mirror. Further, on the reflection surface side, as the amount of heat generation is large by absorption of exposure light, the temperature of the cooling medium supplied to the radiation plate on the mirror reflection surface side must be set to a lower temperature than that of the cooling medium supplied to the radiation plate on the rear surface side.

Third Embodiment

Figure 7:
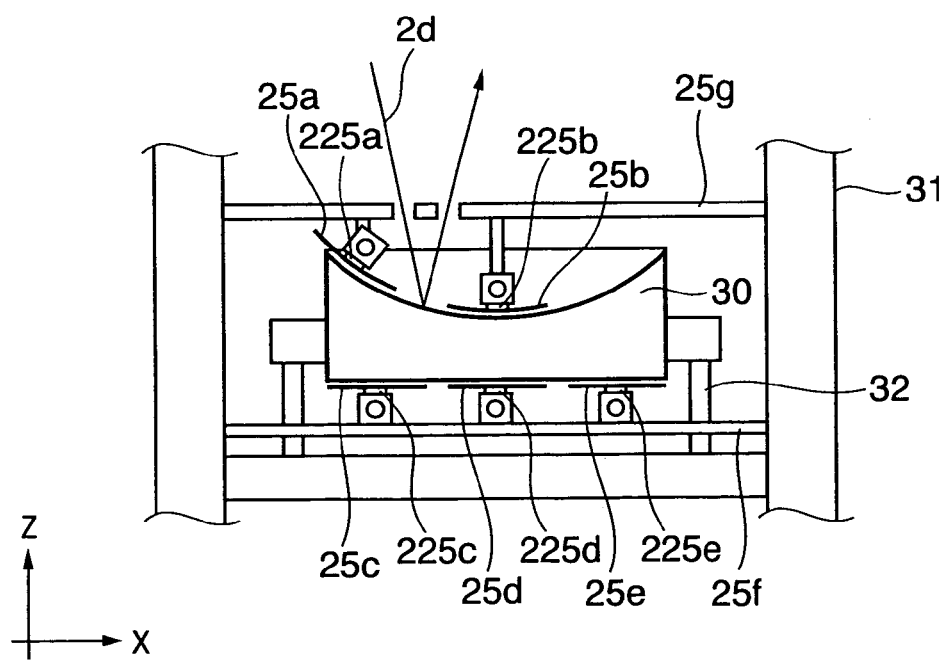
FIG. 7 is an explanatory view showing the mirror cooling mechanism according to a third embodiment of the present invention.

FIG. 7 shows the cooling mechanism according to a third embodiment of the present invention. In FIG. 7, constituent elements corresponding to those in the first embodiment (FIG. 3B) have the same reference numerals. In the first embodiment, the cooling pipes are directly connected to the radiation plates so as to directly cool the radiation plates. In the third embodiment, Peltier elements 225a to 225e as solid heat-transfer elements are provided between the radiation plates 25a to 25e and the cooling pipes 23a to 23e. As shown in FIG. 7, it may be arranged such that the temperature control of the radiation plates is performed by the Peltier elements, and temperature rising portions in heat radiation portions on the rear surfaces of the Peltier elements are cooled by the cooling media in the cooling pipes.

Fourth Embodiment

Figure 8:
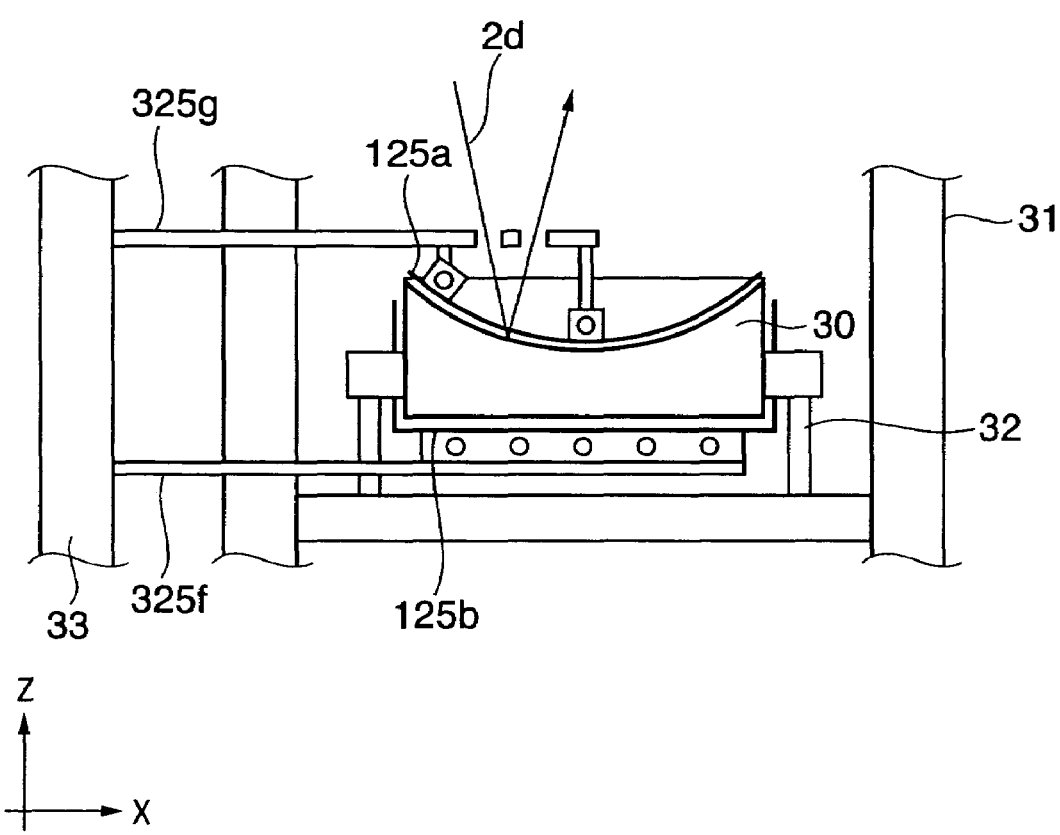
FIG. 8 is an explanatory view showing the mirror cooling mechanism according to a fourth embodiment of the present invention.
Figure 9:
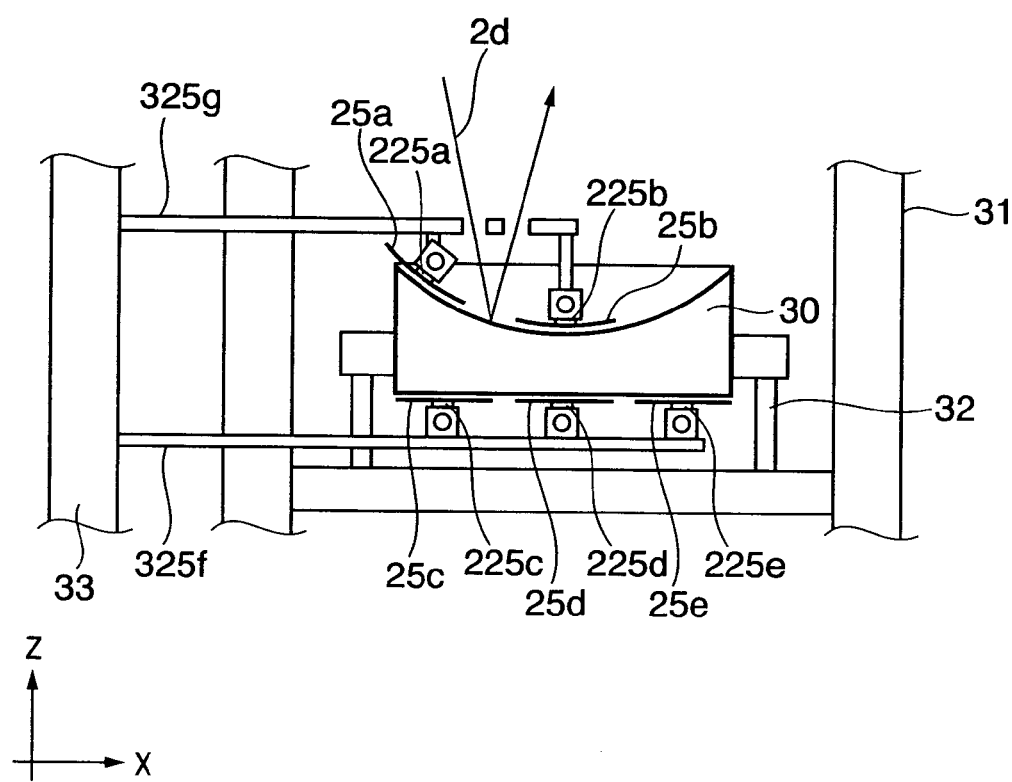
FIG. 9 is an explanatory view showing the mirror cooling mechanism according to the fourth embodiment.
Figure 10A:
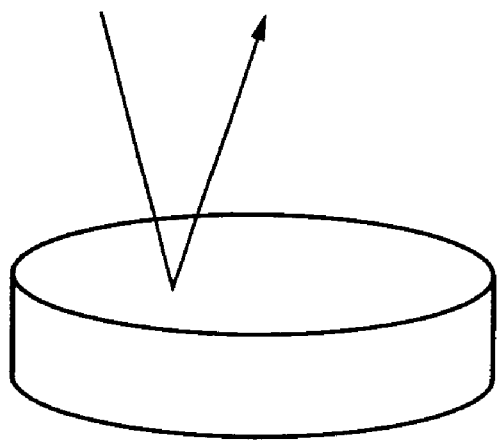
FIGS. 10A and 10B are explanatory views showing the form of the general convex-surface type mirror.
Figure 10B:
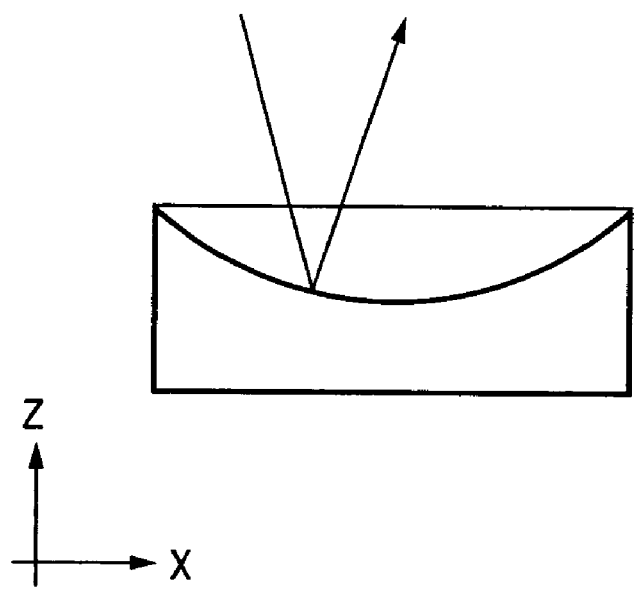

As a fourth embodiment, a modification to the radiation plate supporting method is shown. FIG. 8 is an explanatory view showing the mirror cooling mechanism in FIG. 6 to which the radiation plate supporting method according to the fourth embodiment is applied. Further, FIG. 9 is an explanatory view showing the mirror cooling mechanism in FIG. 7 to which the radiation plate supporting method according to the fourth embodiment is applied.

In the first to third embodiments, the radiation plate support members 25f and 25g supporting the separated plural radiation plates are fixed to the mirror barrel 31 to which the mirror support member 32 is fixed. In the fourth embodiment, to block the influence from the radiation plate support system on the distortion of the mirror support system (there is a possibility that the mechanical distortion of the radiation plate is transmitted to the mirror support system), a radiation plate support base 33 completely separated from the mirror barrel is provided as shown in FIGS. 8 and 9. The radiation plate support base 33 fix-holds radiation plate support members 325f and 325g to support the respective radiation plates.

According to the above-described respective embodiments, plural temperature-controlled radiation plates are separately provided in positions slightly away from the outer periphery of plural reflection mirrors so as to radiation-cool the mirrors in a non-contact state. In this arrangement, cooling of the mirrors can be performed without the application of a load or distortion to the mirrors. That is, the entire mirror can be efficiently and uniformly controlled at a predetermined temperature without distortion in the mirror reflection surface. As a result, the degradation of the accuracy of the mirror surface form can be prevented. In the projection optical system (reduced projection mirror optical system 7), the degradation of image formation performance and illumination to a wafer can be prevented. In the illumination system (exposure light introduction unit 5), the degradation of illumination and illumination evenness to a mask can be prevented. In the light source mirror (light source unit 2), the degradation of illumination due to poor focusing of light source or the like can be prevented. These advantages improve the basic performance, such as exposure accuracy and throughput of the exposure apparatus.

Further, according to the above-described respective embodiments, plural separate radiation plates, temperature-controlled to different temperatures are provided on the reflection surface side and the rear surface side of the mirror. As the arrangement of the plural radiation plates to the mirror outer periphery can be optimized, the radiation-cooling can be performed in correspondence with the temperatures of the respective portions of the mirror.

Further, as the radiation plates are provided in positions approximately along the mirror outer form and away from the mirror surface by a predetermined distance, on the exposure light reflection surface side and the rear surface side of the mirror, uniform radiation-cooling can be performed on the mirror surfaces.

Further, as the temperature measuring device is provided on the reflection mirror base member or in a position near the mirror base member, and the temperatures of the cooling media are controlled so as to temperature-control the respective radiation plates based on the temperature measurement signal from the temperature measuring device, the radiation plates, and by extension, the entire mirror can be maintained at a predetermined temperature.

Further, according to the fourth embodiment, as the surface temperature of the radiation plate is controlled by the solid cooling element such as a Peltier element, the temperature control of the radiation plate can be efficiently realized.

OTHER EMBODIMENT

Next, an embodiment of a device fabrication method utilizing the above-described exposure apparatus will be described.

Figure 11A:
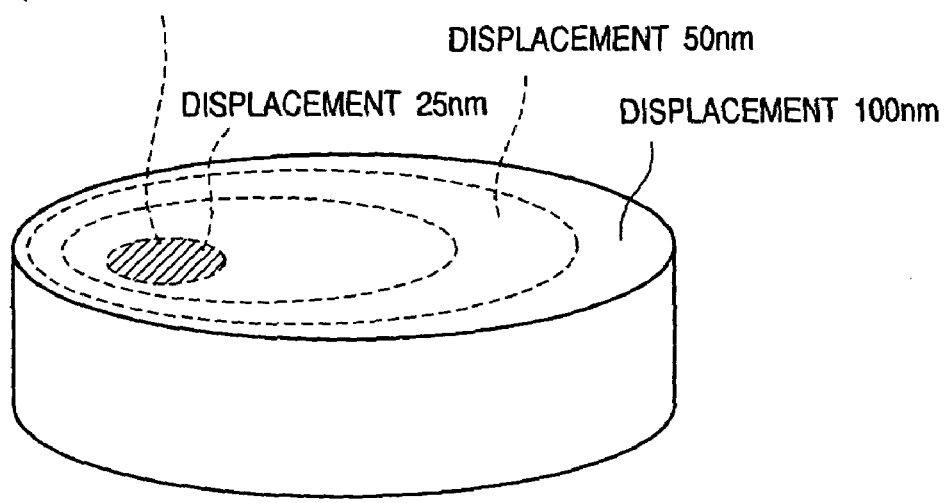
FIGS. 11A and 11B are explanatory views showing the temperature rise in the mirror in FIGS. 10A and 10B.
Figure 11B:
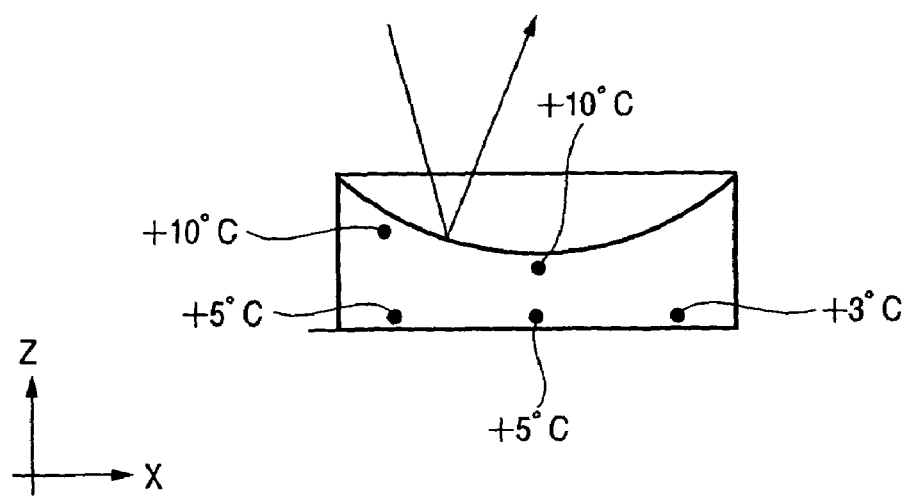

FIGS. 11A and 11B show microdevice (semiconductor chip such as an IC or LSI, a liquid crystal panel, a CCD, a thin-film magnetic head, a micromachine or the like) fabrication flows. At step 1 (circuit designing), a device pattern of a semiconductor device is designed. At step 2 (generation of exposure control data), exposure control data for the exposure apparatus is generated based on a designed circuit pattern. On the other hand, at step 3 (wafer fabrication), a wafer is fabricated by using material such as silicon. At step 4 (wafer process), called a preprocess, an actual circuit is formed on the wafer by a lithography technique using the exposure apparatus in which above-prepared exposure control data has been inputted and the wafer. At the next step 5 (assembly), called a postprocess, a semiconductor chip is fabricated by using the wafer formed at step 4. Step 5 includes an assembly process (dicing and bonding), a packaging process (chip encapsulation) and the like. At step 6 (inspection), inspections such as a device operation check, a durability test and the like are performed on the semiconductor device formed at step 5. The semiconductor device is completed through these processes, and is shipped (step 7).

Figure 12:
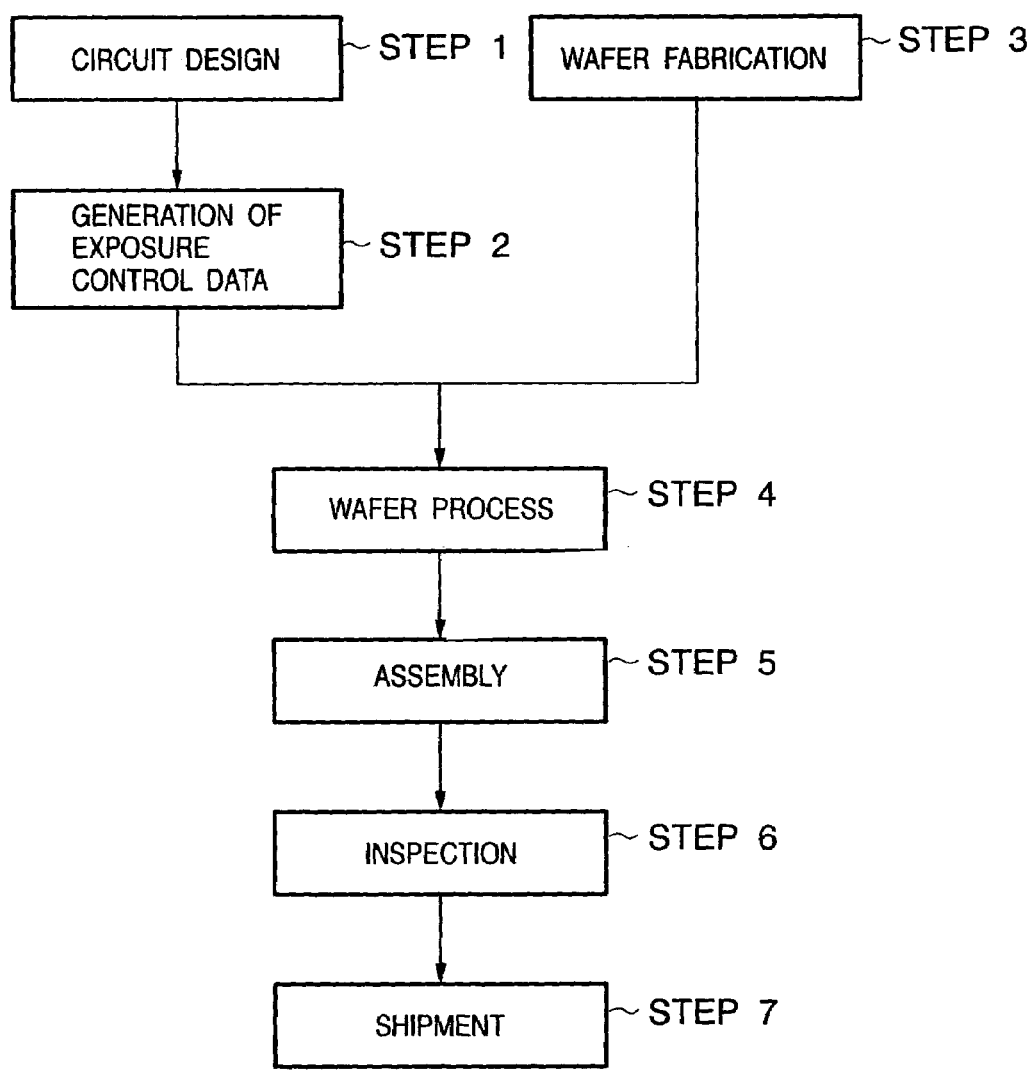
FIG. 12 is a flowchart showing a semiconductor device fabrication flow.
Figure 13:
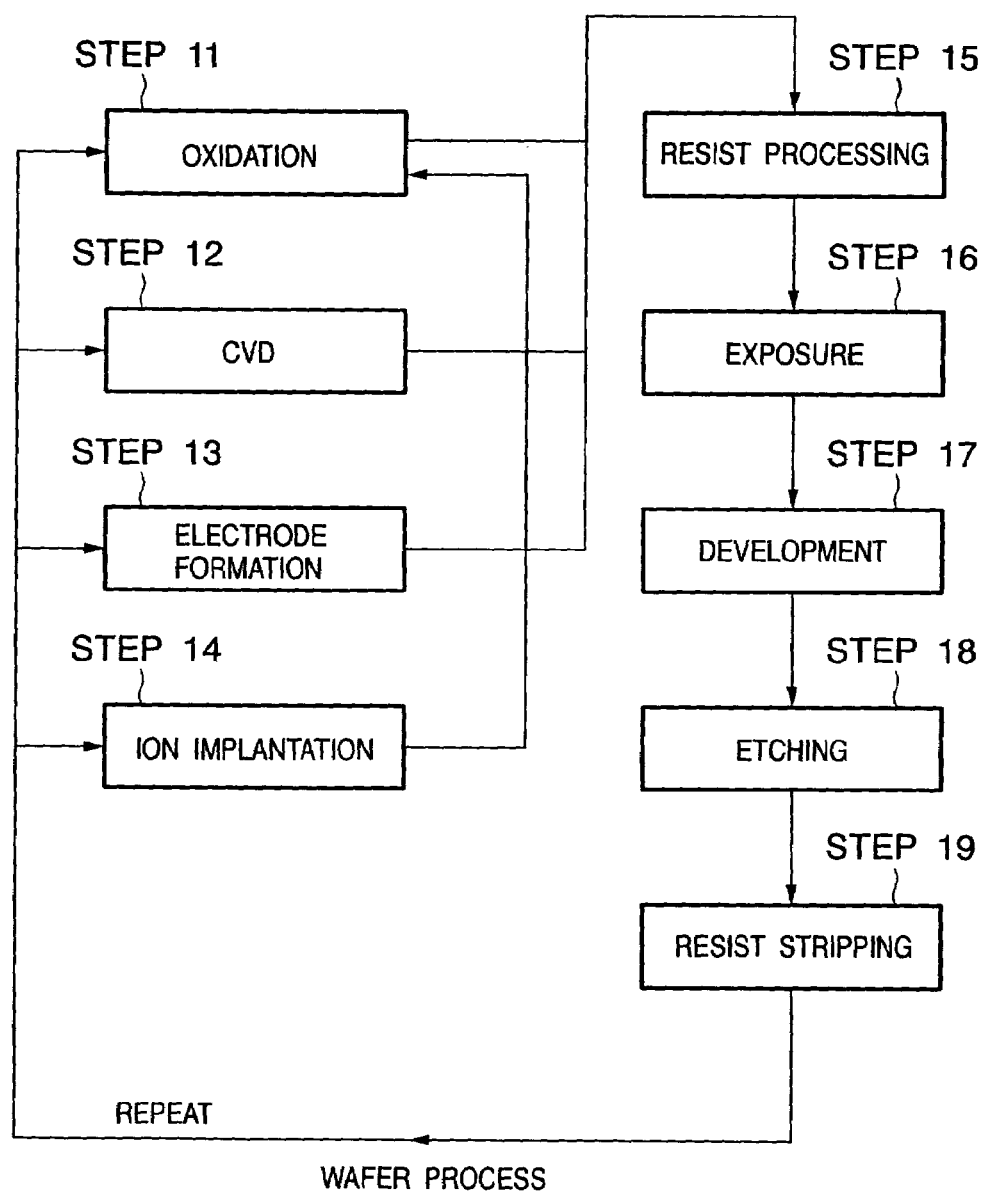
FIG. 13 is a flowchart showing the details of a wafer process in FIG. 12.

FIG. 12 shows the detailed flow of the wafer process. At step 11 (oxidation), the surface of the wafer is oxidized. At step 12 (CVD), an insulating film is formed on the surface of the wafer. At step 13 (electrode formation), electrodes are formed by vapor deposition on the wafer. At step 14 (ion implantation), ions are injected into the wafer. At step 15 (resist processing), the wafer is coated with photoresist. At step 16 (exposure), the circuit pattern is exposure-printed on the wafer by the above-described exposure apparatus. At step 17 (development), the exposed wafer is developed. At step 18 (etching), other portions than the developed resist image are removed. At step 19 (resist stripping), the resist which is unnecessary after the completion of etching is removed. These steps are repeated, to form a multiple layers of circuit patterns on the wafer.

According to the above-described device production method, a device having a fine circuit pattern can be produced.

As described above, according to the present invention, the temperature rise of a mirror used in a reflection optical system of an exposure apparatus can be suppressed, and the accuracy of the surface form of the mirror reflection surface can be maintained.

As many apparently widely different embodiments of the present invention can be made without departing from the spirit and scope thereof, it is to be understood that the invention is not limited to the specific embodiments thereof except as defined in the appended claims.

The invention claimed is:

1. An apparatus comprising:
    a mirror having a reflection surface that reflects light and a rear surface that is located opposite to the reflection surface;
    a heat-radiation plate arranged outside said mirror and outside a passage area for light incident on and reflected from the reflection surface, and facing the reflection surface, said heat-radiation plate being spaced away from the reflection surface, and arranged nearer the reflection surface than the rear surface; and
    a cooling mechanism configured to cool said heat-radiation plate.

2. An apparatus according to claim 1, further comprising another heat-radiation plate arranged outside said mirror and the passage area, and facing the rear surface, said another heat-radiation plate being spaced away from the rear surface, and arranged nearer the rear surface than the reflection surface.

3. An apparatus according to claim 1, wherein the reflection surface is curved, and said heat-radiation plate includes a curved surface corresponding to the reflection surface.

4. An apparatus according to claim 1, wherein said heat-radiation plate is divided into a plurality of elements thereof, and the passage area is arranged between at least two of said plurality of elements.

5. An apparatus according to claim 4, wherein said cooling mechanism is configured to cool said plurality of elements individually.

6. An apparatus according to claim 1, wherein said cooling mechanism includes a pipe which is connected to said heat-radiation plate, and through which a coolant flows.

7. An apparatus according to claim 6, wherein said cooling mechanism includes:
   a first thermometer configured to measure temperature of said mirror;
   a second thermometer configured to measure temperature of the coolant; and
   a controller configured to estimate an amount of light incident on the reflection surface to obtain an estimated amount of the light, and to control temperature of the coolant based on measurement obtained by said first thermometer, measurement obtained by said second thermometer and the estimated amount of the light.

8. An apparatus according to claim 7, wherein said first thermometer is a radiation thermometer arranged away from said mirror.

9. An apparatus according to claim 5, further comprising a thermometer configured to measure temperature of said mirror at a plurality of points,
   wherein said cooling mechanism is configured to cool said plurality of elements individually based on measurement obtained by said thermometer.

10. An apparatus according to claim 1, wherein said heat-radiation plate includes an opening in which the passage area is arranged.

11. An apparatus according to claim 1, wherein said cooling mechanism includes:
    a solid heat-transfer element attached to said heat-radiation plate and configured to transfer heat from said heat-radiation plate; and
    a pipe which is connected to said solid heat-transfer element and in which a coolant flows.

12. An apparatus according to claim 1, further comprising:
    a mirror barrel configured to accommodate said mirror;
    a mirror support fixed to said mirror barrel and configured to support said mirror in said mirror barrel; and
    a heat-radiation plate support configured to support said heat-radiation plate in said mirror barrel.

13. An apparatus according to claim 12, further comprising:
    a base which is separated from said mirror barrel and to which said heat-radiation plate support is fixed.

14. An exposure apparatus for exposing a substrate to light via an original, said apparatus comprising:
    a mirror having a reflection surface that reflects light and a rear surface that is located opposite to the reflection surface;
    a heat-radiation plate arranged outside said mirror and a passage area for light incident on and reflected from the reflection surface, and facing the reflection surface, said heat-radiation plate being spaced away from the reflection surface, and arranged nearer from the reflection surface than from the rear surface; and
    a cooling mechanism configured to cool said heat-radiation plate,
    wherein said mirror is configured and positioned to guide light to at least one of the original and the substrate.

15. A method of fabricating a device, said method comprising steps of:
    exposing a substrate to light via an original using an exposure apparatus, the exposure apparatus comprising a mirror having a reflection surface that reflects light and a rear surface that is located opposite to the reflection surface; a heat-radiation plate arranged outside said mirror and a passage area for light incident on and reflected from the reflection surface, and facing the reflection surface, said heat-radiation plate being spaced away from the reflection surface, and arranged nearer from the reflection surface than from the rear surface; and a cooling mechanism configured to cool said heat-radiation plate, wherein said mirror is configured and positioned to guide light to at least one of the original and the substrate;
    developing the exposed substrate; and
    processing the developed substrate to fabricate the device.

* * * * *

UNITED STATES PATENT AND TRADEMARK OFFICE
CERTIFICATE OF CORRECTION

| | |
|---|---|
| PATENT NO. | : 7,349,063 B2 |
| APPLICATION NO. | : 10/647376 |
| DATED | : March 25, 2008 |
| INVENTOR(S) | : Yoshikazu Miyajima |

It is certified that error appears in the above-identified patent and that said Letters Patent is hereby corrected as shown below:

ON THE COVER PAGE:
At Item (74), Attorney, Agent, or Firm, "Fitzpatrick Cella Harper & Scinto" should read --Fitzpatrick, Cella, Harpo & Scinto--.
At Item (56), FOREIGN PATENT DOCUMENTS, "01/42855" should read --WO 01/42855--.

COLUMN 1:
Line 45, "views" should read --views showing--.
Line 56, "system mirror" should read --system mirror,--.

COLUMN 2:
Line 8, "apparatus" should read --apparatus,--.

COLUMN 3:
Line 9, "10B." should read --10B;--.

COLUMN 5:
Line 19, "with a" should read --with an--.
Line 54, "show" should read --shown--.

COLUMN 6:
Line 53, "(e.g." should read --(e.g.,--.
Line 55, "e.g." should read --e.g.,--.

COLUMN 10:
Line 31, "a" should be deleted.

UNITED STATES PATENT AND TRADEMARK OFFICE
CERTIFICATE OF CORRECTION

PATENT NO. : 7,349,063 B2
APPLICATION NO. : 10/647376
DATED : March 25, 2008
INVENTOR(S) : Yoshikazu Miyajima It is certified that error appears in the above-identified patent and that said Letters Patent is hereby corrected as shown below:

COLUMN 12:
Line 18, "from" should be deleted.
Line 19, "from" should be deleted.
Line 35, "from" (both occurrences) should be deleted.

Signed and Sealed this

Tenth Day of February, 2009

JOHN DOLL
*Acting Director of the United States Patent and Trademark Office*